United States Patent
Kanzaki et al.

(10) Patent No.: US 12,114,540 B2
(45) Date of Patent: Oct. 8, 2024

(54) METHOD FOR MANUFACTURING DISPLAY DEVICE, AND DISPLAY DEVICE

(71) Applicant: SHARP KABUSHIKI KAISHA, Sakai (JP)

(72) Inventors: Yohsuke Kanzaki, Sakai (JP); Seiji Kaneko, Sakai (JP); Takao Saitoh, Sakai (JP); Masahiko Miwa, Sakai (JP); Masaki Yamanaka, Sakai (JP); Yi Sun, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 884 days.

(21) Appl. No.: 17/270,446

(22) PCT Filed: Aug. 24, 2018

(86) PCT No.: PCT/JP2018/031411
§ 371 (c)(1),
(2) Date: Feb. 23, 2021

(87) PCT Pub. No.: WO2020/039588
PCT Pub. Date: Feb. 27, 2020

(65) Prior Publication Data
US 2021/0257427 A1    Aug. 19, 2021

(51) Int. Cl.
*H10K 59/124* (2023.01)
*H01L 29/66* (2006.01)
*H01L 29/786* (2006.01)
*H10K 59/12* (2023.01)
*H10K 59/131* (2023.01)

(52) U.S. Cl.
CPC ..... *H10K 59/124* (2023.02); *H01L 29/66742* (2013.01); *H01L 29/7869* (2013.01); *H10K 59/131* (2023.02); *H10K 59/1201* (2023.02)

(58) Field of Classification Search
None
See application file for complete search history.

(56) References Cited

U.S. PATENT DOCUMENTS 5,563,427 A    10/1996  Yudasaka et al.
5,953,582 A     9/1999  Yudasaka et al.
(Continued)

FOREIGN PATENT DOCUMENTS

JP    H05100236 A    4/1993
JP    2005223347 A   8/2005
(Continued)

*Primary Examiner* — Alexander G Ghyka
(74) *Attorney, Agent, or Firm* — ScienBiziP, P.C.

(57) ABSTRACT

A display device (1) includes: a substrate (2); and a first transistor (1a) formed on the substrate (2). The first transistor (1a) includes: an oxide semiconductor layer (4) formed on the substrate (2); a gate insulating layer (5) formed on the oxide semiconductor layer (4); and a gate electrode (6) formed on the gate insulating layer (5). The oxide semiconductor layer (4) includes: a conductive region (4a) provided with conductivity; a first resistance region (4b) positioned below the gate electrode (6); and a second resistance region (4c) provided between the conductive region (4a) and the first resistance region (4b), and positioned outside the gate electrode (6). The first resistance (4b) is larger in resistance than the second resistance region (4c).

3 Claims, 10 Drawing Sheets

(56) References Cited

U.S. PATENT DOCUMENTS

| | | | |
|---|---|---|---|
| 2005/0224799 A1* | 10/2005 | Yamamoto | H01L 29/66757 |
| | | | 257/349 |
| 2009/0283763 A1 | 11/2009 | Park et al. | |
| 2016/0322389 A1* | 11/2016 | Chen | G02F 1/136286 |
| 2017/0117374 A1 | 4/2017 | Tanaka | |
| 2017/0373094 A1 | 12/2017 | Park et al. | |
| 2018/0175246 A1* | 6/2018 | Murai | H01L 27/1214 |

FOREIGN PATENT DOCUMENTS

| | | | |
|---|---|---|---|
| JP | 2009278115 A | 11/2009 | |
| JP | 2017085079 A | 5/2017 | |

* cited by examiner

METHOD FOR MANUFACTURING DISPLAY DEVICE, AND DISPLAY DEVICE

TECHNICAL FIELD

The present disclosure relates to a method for manufacturing a display device to be formed on a substrate, and the display device.

BACKGROUND ART

Thanks to recent advancement of organic light emitting diode (OLED) techniques, products equipped with organic electroluminescent (EL) display devices are being widely available. A typical organic EL display device includes a pixel circuit to supply a current to a pixel in a light-emitting layer. The pixel circuit is usually produced in a patterning step that involves forming a metal film on a substrate, and patterning the metal film. In the patterning of the metal film, a resist film formed on the metal film is exposed and developed by photolithography (in a photolithography step). The developed resist film acts as an etching mask for etching.

In the patterning step of the metal film, a foreign object on the etching mask in the etching leaves a portion of the metal film unetched. Such an unetched portion could develop a leakage defect to be a cause of wiring short circuit. As a counter measure to the unetched portion, methods for manufacturing a liquid crystal display element include, for example, a process known in the art; that is, retrying that involves forming the etching mask and etching the metal film again (see, for example, Patent Document 1).

CITATION LIST

Patent Literature

[Patent Document 1] Japanese Unexamined Patent Application Publication No. H0S-100236

SUMMARY

Technical Problem

In a method for manufacturing a liquid crystal display device cited in Patent Document 1, a stripe pattern of metal wiring is formed by etching. An etchant in fine mist is sprayed to the metal film in order to correct an etching defect left in the stripe pattern. Prior to the spray of the etchant, a resist pattern is formed to correct the etching defect left in the metal wiring.

A pixel circuit for an OLED uses a drive transistor for control. The problem is, in application of an oxide semiconductor to the OLED, controlling the brightness could be difficult, depending on characteristics of the drive transistor. Even though the above method for manufacturing a liquid crystal display device corrects the defect, the method fails to adjust the characteristics of the drive transistor.

In order to solve the above problem, the present disclosure is intended to provide a method for manufacturing a display device whose transistor has variation in characteristic, and to provide the display device.

Solution to Problem

A method according to the present disclosure is directed to one for manufacturing a display device including a substrate and a first transistor formed on the substrate. The method manufactures the display device by sequentially performing: a semiconductor layer forming step of forming an oxide semiconductor layer on the substrate; a semiconductor layer etching step of etching the oxide semiconductor layer; an insulating film forming step of forming a gate insulating film on the substrate and the oxide semiconductor layer; a gate forming step of forming a gate electrode conductive film on the gate insulating film; a first photolithography step of applying a resist to the gate electrode conductive film, and forming, with a first mask, a first resist pattern from the resist; a first gate etching step of etching the gate electrode conductive film with the first resist pattern as a mask, and shaping the gate electrode conductive film into a first resist pattern gate electrode conductive film in accordance with the first resist pattern; an insulating film etching step of etching the gate insulating film with the first resist pattern as a mask, and shaping the gate insulating film into a gate insulating layer in accordance with the first resist pattern; a first removing step of removing the first resist pattern; a second photolithography step of applying the resist to the first resist pattern gate electrode conductive film, and forming, with a second mask, a second resist pattern from the resist; a second gate etching step of etching the first resist pattern gate electrode conductive film with the second resist pattern as a mask, and shaping the first resist pattern gate electrode conductive film into a gate electrode in accordance with the second resist pattern; and a second removing step of removing the second resist pattern. The method further includes a conductivity providing step of providing, with the gate insulating layer as a mask, conductivity to a portion of the oxide semiconductor layer outside the first resist pattern, so that the portion acts as a conductive region.

In the method according to the present disclosure, a mask pattern used in the second photolithography step may be the same as a mask pattern used in the first photolithography step. An exposure dose set for the second photolithography step may be different from an exposure dose set for the first photolithography step.

In the method according to the present disclosure, a mask pattern used in the second photolithography step may be different from a mask pattern used in the first photolithography step. The first resist pattern may be formed wider in channel length direction than the second resist pattern.

In the method according to the present disclosure, the display device may include a plurality of wires corresponding to a pixel circuit and formed of the same material, and in the same layer, as the gate electrode is formed. The wires may be provided across opposing ends of a display region. A wire shaped in the first gate etching step may be wider than the wires shaped in the second gate etching step.

In the method according to the present disclosure, the display device may include a plurality of wires corresponding to a pixel circuit and formed of the same material, and in the same layer, as the gate electrode is formed. The wires may be provided across opposing ends of a display region. In the first gate etching step, at least two or more of the wires may be shaped while connected together. In the second gate etching step, the at least two or more wires shaped while connected together in the first gate etching step may be separated from one an other.

In the method according to the present disclosure, the wires may include a gate control line and a light-emission control line. In the first gate etching step, the gate control wire and the light-emission control line corresponding to a single pixel circuit may be shaped while connected together.

In the second gate etching step, the gate control wire and the light-emission control line shaped while connected together in the first gate etching step may be separated from each other.

The method according to the present disclosure may further include a self-aligning step that may be performed between the second gate etching step and the second removing step, and may involve etching the gate insulating layer with the second resist pattern as a mask so that the gate insulating layer matches the gate electrode in shape.

In the method according to the present disclosure, the oxide semiconductor layer of the first transistor may include: the conductive region; a first resistance region positioned below the gate electrode; and a second resistance region positioned between the conductive region and the first resistance region. The first resistance region may be larger in resistance than the second resistance region.

In the method according to the present disclosure, the second photolithography step may involve forming: a first transistor region in which the resist covers a portion of the gate electrode; and a second transistor region in which the resist covers all of the gate electrode. The second gate etching step may involve etching the gate electrode in the first transistor region to form the first transistor, and protecting, with the resist, the gate electrode in the second transistor region to form the second transistor. The oxide semiconductor layer of the second transistor may include: the conductive region; and the first resistance region positioned below the gate electrode.

In the method according to the present disclosure, the conductivity providing step may be performed between the insulating film etching step and the second photolithography step.

In the method according to the present disclosure, the conductivity providing step may be performed after the second gate etching step.

The method according to the present disclosure may further include a step of forming a display element after the second gate etching step.

A display device according to the present disclosure is one including: a substrate; and a first transistor formed on the substrate. The first transistor includes: an oxide semiconductor layer formed on the substrate; a gate insulating layer formed on the oxide semiconductor layer; and a gate electrode formed on the gate insulating layer. The oxide semiconductor layer includes: a conductive region provided with conductivity; a first resistance region positioned below the gate electrode; and a second resistance region provided between the conductive region and the first resistance region, and positioned outside the gate electrode. The first resistance region is larger in resistance than the second resistance region.

In the display device according to the present disclosure, the gate insulating layer may cover the second resistance region, and may be longer in channel length direction than the gate electrode.

In the display device according to the present disclosure, the gate insulating layer may match the first resistance region and the gate electrode in shape. The second resistance region may be provided outside the gate insulating layer.

The display device according to the present disclosure may further include: the oxide semiconductor layer formed on the substrate; the gate insulating layer formed on the oxide semiconductor layer; and the gate electrode formed on the gate insulating layer. The oxide semiconductor layer may include: the conductive region provided with conductivity; and the first resistance region positioned below the gate electrode. The gate insulating layer may match the first resistance region and the gate electrode in shape. The first resistance region may be provided in contact with the conductive region.

Advantageous Effects of Disclosure

In the present disclosure, an oxide semiconductor layer not including a conductive region is provided between the oxide semiconductor layer directly below a gate electrode and the oxide semiconductor layer acting as the conductive region. Such a feature allows a transistor to have variation in characteristic.

DESCRIPTION OF EMBODIMENTS

First Embodiment

Described below is a display device according to a first embodiment of the present disclosure, with reference to the drawings.

Figure 1:
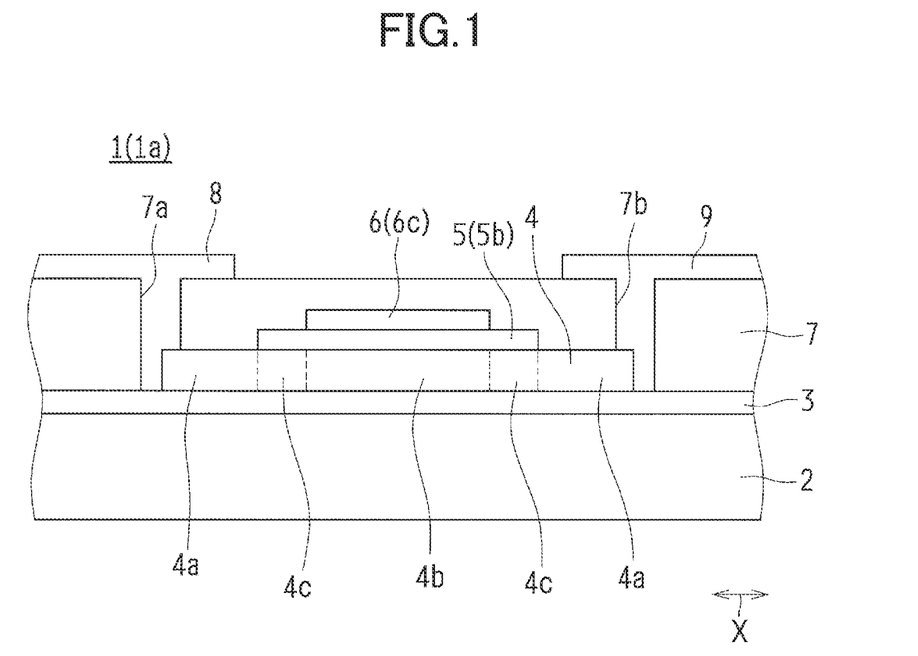
FIG. 1 is a cross-sectional view schematically illustrating a display device according to a first embodiment of the present disclosure.

FIG. 1 is a cross-sectional view schematically illustrating the display device according to the first embodiment of the present disclosure. In view of visibility, FIG. 1 is not hatched.

A first transistor 1a of a display device 1 (a thin-film transistor, or a TFT) according to the first embodiment of the present disclosure includes: a substrate 2; an underlayer 3; an oxide semiconductor layer 4; a gate insulating layer 5; a gate electrode 6; and a protective layer 7 stacked on top of an other in the stated order. Note that a step for manufacturing the first transistor 1a and details of the components will be described, with reference to FIGS. 2 to 10 to be shown later.

In FIG. 1, one transistor (the first transistor 1a) formed on the substrate 2 is illustrated in an enlarged view. Furthermore, two or more transistors may be formed on the substrate 2.

The underlayer 3 is formed to cover the entire substrate 2. Note that, for the sake of description, a direction along a surface of the substrate 2 may be referred to as a channel length direction X. Moreover, the first transistor 1a and a second transistor 1b to be described later may collectively be referred to as a transistor.

The oxide semiconductor layer 4, formed on the underlayer 3, includes a plurality of oxide semiconductor layers 4 each provided to one of transistors. That is, the oxide semiconductor layer 4 is spaced apart from an oxide semiconductor layer 4 of an other transistor. The oxide semiconductor layer 4 includes: conductive regions 4a each positioned at one of opposing ends of the oxide semiconductor layer 4 in the channel length direction X; a first resistance region 4b positioned in a center of the oxide semiconductor layer 4 in the channel length direction X; and second resistance regions 4c each provided one of (i) between the first resistance region 4b and one of the conductive regions 4a and (ii) between the first resistance region 4b and an other one of the conductive regions 4a. Each of the conductive regions 4a is a region, of the oxide semiconductor, with the resistance reduced. The first resistance region 4b is a region, of the oxide semiconductor, with the resistance not reduced.

The gate insulating layer 5 (a first resist pattern gate insulating layer 5b) is provided on the oxide semiconductor layer 4, and overlaps the first resistance region 4b and the second resistance regions 4c of the oxide semiconductor layer 4. The gate electrode 6 (a second resist pattern gate electrode 6c) is provided on the gate insulating layer 5, and disposed across the first resistance region 4b from the gate insulating layer 5. Hence, the second resistance regions 4c are positioned outside the gate electrode 6. Moreover, the gate insulating layer 5 is formed longer in the channel length direction X than the gate electrode 6.

Note that the first resist pattern gate insulating layer 5b is the gate insulating layer 5 corresponding to a first resist pattern, and the second resist pattern gate electrode 6e is the gate electrode 6 corresponding to a second resist pattern.

The first resist pattern and the second resist pattern will be described in detail, with reference to FIGS. 2 to 10 to be shown later.

The protective layer 7 is formed to cover the oxide semiconductor layer 4 and the gate electrode 6. In the first transistor 1a, provided on the protective layer 7 are a source electrode 8 (on the observer's left in FIG. 1) and a drain electrode 9 (on the observer's right in FIG. 1). The source electrode 8 and the drain electrode 9 are spaced apart from each other in the channel length direction X.

The source electrode 8 is electrically connected, through a source contact hole 7a provided to the protective layer 7, to one of the conductive regions 4a (on the observer's left in FIG. 1) in the oxide semiconductor layer 4. The drain electrode 9 is electrically connected, through a drain contact hole 7b provided to the protective layer 7, to an other one of the conductive regions 4a (on the observer's right in FIG. 1) in the oxide semiconductor layer 4.

Next, a step for manufacturing a transistor is described in detail, with reference to FIGS. 2 to 10.

Figure 2:
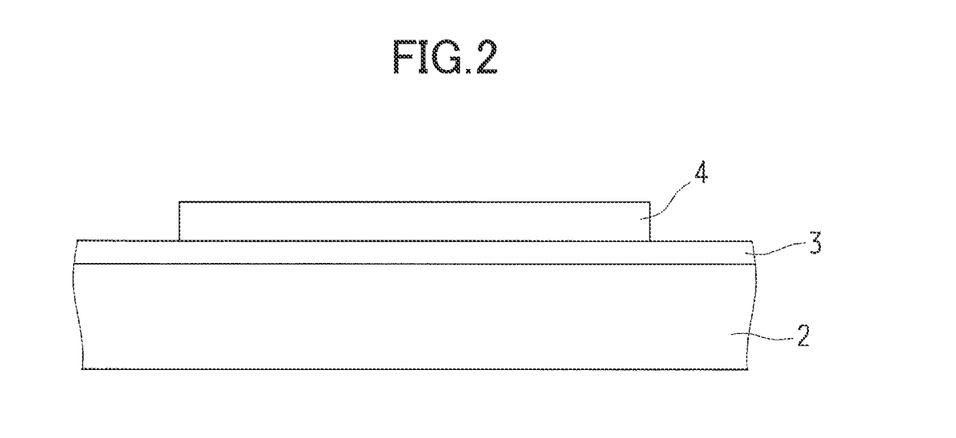
FIG. 2 is a cross-sectional view schematically illustrating a transistor after a semiconductor layer forming step and a semiconductor layer etching step.

FIG. 2 is a cross-sectional view schematically illustrating a transistor after a semiconductor layer forming step and a semiconductor layer etching step.

Prior to forming the oxide semiconductor layer 4 in the step for manufacturing the transistor, the underlayer 3 serving as an insulating film is formed on the substrate. Examples of the substrate 2 may include a glass substrate, a silicone substrate, and a heat-resistant plastic substrate (a resin substrate). The plastic substrate (the resin substrate) may be made of such materials as polyethylene terephthalate (PET), polyethylene naphthalate (PEN), polyethersulfone (PES), acrylic resin, and polyimide.

In this embodiment, the underlayer 3 is made of an $SiO_2$ film formed by the chemical vacuum deposition (CVD) to have a thickness of 375 nm. The underlayer 3 may be formed in any given manner. For example, the underlayer 3 may be formed of one of such materials as silicon oxide ($SiO_x$), silicon nitride ($SiN_x$), silicon oxide nitride ($SiO_xN_y$, where x>y), silicon nitride oxide ($SiN_xO_y$, where x>y), aluminum oxide, and tantalum oxide. The underlayer 3 may also be a multilayer formed of two or more of such materials.

Next, in the semiconductor layer forming step, the oxide semiconductor layer 4 is formed on the underlayer 3. The oxide semiconductor layer 4 is formed by, for example, sputtering. An example of the oxide semiconductor layer 4 is an In—Ga—Zn—O based semiconductor film having a thickness of 30 nm or more and 100 nm or less. In the semiconductor layer etching step, the oxide semiconductor layer 4 is patterned by photolithography and etching to be shaped into islands each corresponding to one of the transistors.

Note that the oxide semiconductor layer 4 may undergo a heat treatment (an annealing treatment) between the semiconductor layer forming step and the semiconductor layer etching step. The annealing treatment is given at, for example, 200° C. to 500° C.

Figure 3:
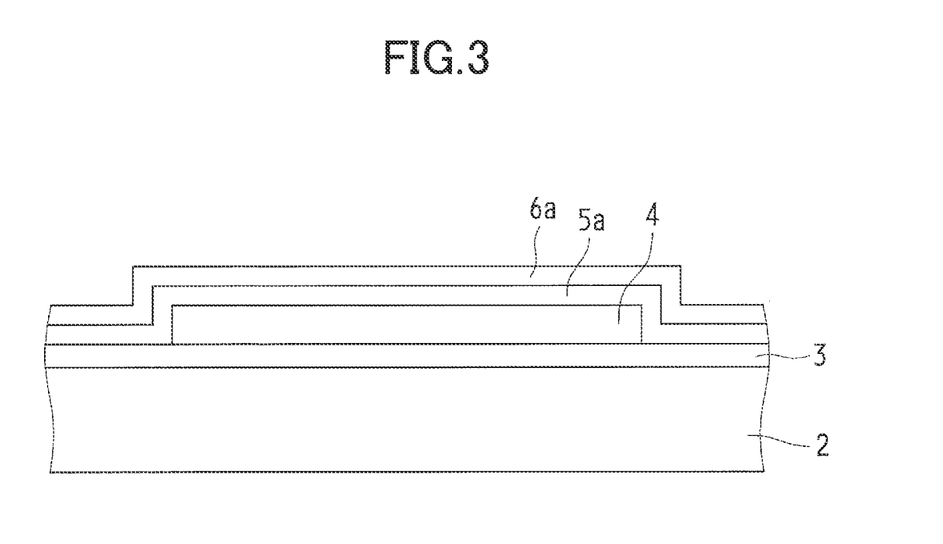
FIG. 3 is a cross-sectional view schematically illustrating the transistor after an insulating layer forming step and a gate forming step.

FIG. 3 is a cross-sectional view schematically illustrating the transistor after an insulating layer forming step and a gate forming step.

In FIG. 3, the oxide semiconductor layer 4 of FIG. 2 is covered with a gate insulating film Sa and a gate electrode conductive film 6a. Specifically, in the insulating layer forming step, the gate insulating film Sa is made of silicon oxide ($SiO_x$) formed by the CVD. The gate insulating film Sa has a thickness of 80 nm or more and 250 nm or less. An example thickness of the gate insulating film 5a is 150 nm. The gate insulating film Sa, a base of the gate insulating layer 5, may be made of the same material as that of the underlayer 3. The gate insulating film 5a may be a multilayer film.

The gate electrode conductive film 6a, a base of the gate electrode 6, is formed by sputtering. The gate electrode conductive film 6a is a multilayer film including: a lower layer formed of an Al film having a thickness of 350 nm; and an upper layer formed of a MON film having a thickness of 50 nm. The gate electrode conductive film 6a may be formed of any given film. For example, the gate electrode conductive film 6a may be a metal film containing an element selected from among aluminum (Al), tungsten (W), molybdenum (Mo), tantalum (Ta), chromium (Cr), titanium (Ti), and copper (Cu), or an alloy film containing two or more of such elements as components. The gate electrode conductive film 6a may also be a multilayer film including two or more of such films.

Figure 4:
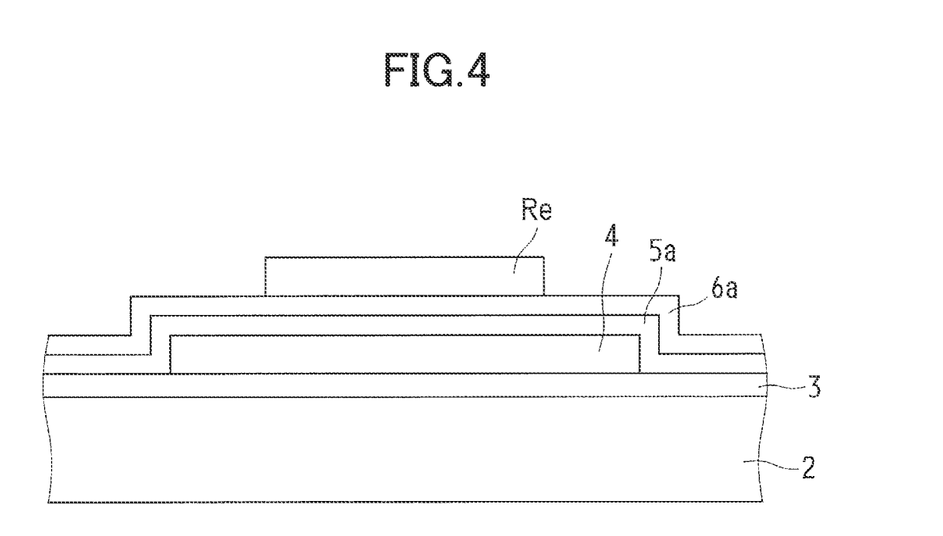
FIG. 4 is a cross-sectional view schematically illustrating the transistor in a first photolithography step.

FIG. 4 is a cross-sectional view schematically illustrating the transistor in a first photolithography step.

In the first photolithography step, the gate electrode conductive film 6a of FIG. 3 is covered with a resist mask Re patterned by photolithography. The resist mask Re is provided to overlap the first resistance region 4b and the second resistance regions 4c illustrated in FIG. 1, and is formed as a first resist pattern covering only a portion of the gate electrode conductive film 6a.

Figure 5:
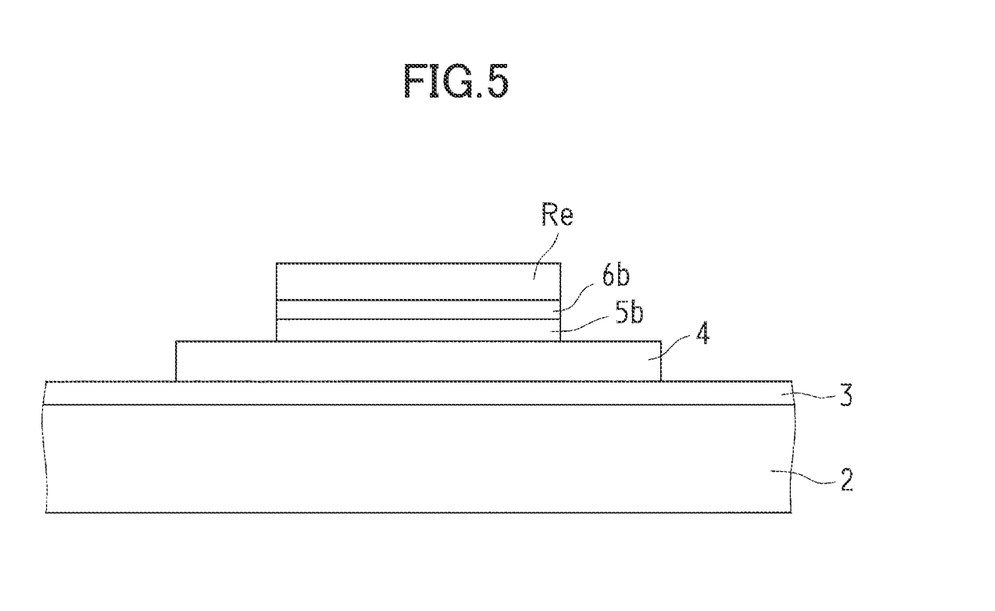
FIG. 5 is a cross-sectional view schematically illustrating the transistor after a first gate etching step and an insulating layer etching step.

FIG. 5 is a cross-sectional view schematically illustrating the transistor after a first gate etching step and an insulating layer etching step.

In FIG. 5, the gate electrode conductive film 6a and the gate insulating film 5a of FIG. 4 are simultaneously etched (by, for example, dry etching). That is, the first gate etching step and the insulating layer etching step are sequentially carried out, using the same resist mask Re. As a result, the gate electrode conductive film 6a and the gate insulating film 5a illustrated in FIG. 4 are removed except a portion covered with the resist mask Re, leaving a first resist pattern gate electrode 6b and the first resist pattern gate insulating layer 5b illustrated in FIG. 5. Hence, the first resist pattern gate electrode 6b and the first resist pattern gate insulating layer 5b match in pattern shape, and are shaped in accordance with the first resist pattern.

Note that the match here does not mean a precise match, and includes a dimensional deviation of several micrometers caused by a difference in, for example, etching rate. Hence, the first resist pattern gate electrode 6b and the first resist pattern gate insulating layer 5b are matched in pattern shape to be self-aligned. Such a feature makes it possible to precisely position both the first resist pattern gate electrode 6b and the first resist pattern gate insulating layer 5b with the etching steps simplified.

Figure 6:
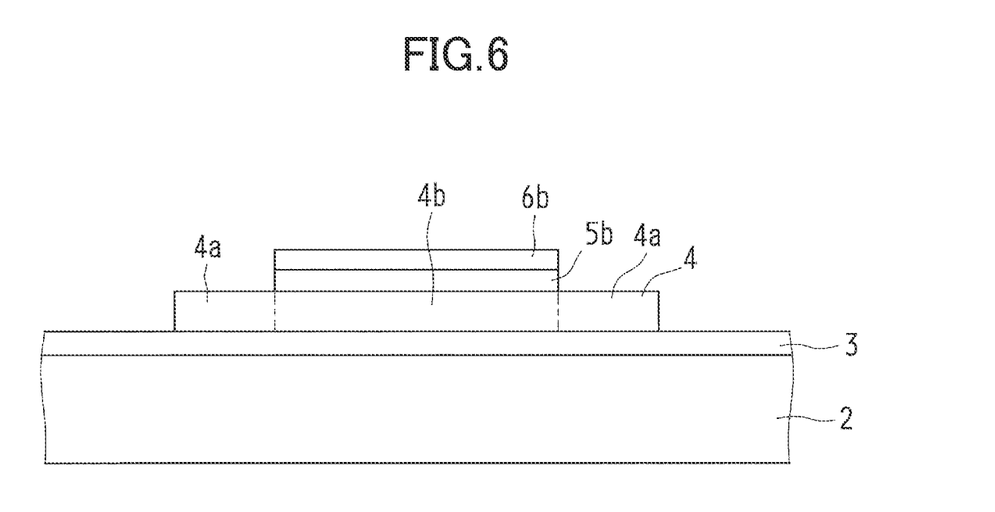
FIG. 6 is a cross-sectional view schematically illustrating the transistor in a conductivity providing step.

FIG. 6 is a cross-sectional view schematically illustrating the transistor in a conductivity providing step.

Prior to a treatment with plasma in the conductivity providing step, a first removal step is carried out. The resist mask Re is removed when the etching to form the first resist pattern gate electrode 6b and the first resist pattern gate insulating layer 5b is completed. The conductivity providing step involves treating the entire face of the substrate 2 with plasma above the first resist pattern gate electrode 6b. Examples of the plasma treatment include treatments with hydrogen plasma and He plasma. In the plasma treatment, the first resist pattern gate electrode 6b functions as a mask, such that the resistance of the oxide semiconductor layer 4 is reduced except a portion covered with the first resist pattern gate electrode 6b. That is, the resistance of the first resistance region 4b directly below the first resist pattern gate electrode 6b is not reduced, and the resistance of the conductive regions 4a is reduced.

Note that the conductivity providing step is carried out after, but not limited to, a first etching step. Alternatively, the conductivity providing step may be carried out in a different order, and the detail thereof will be described later.

Figure 7:
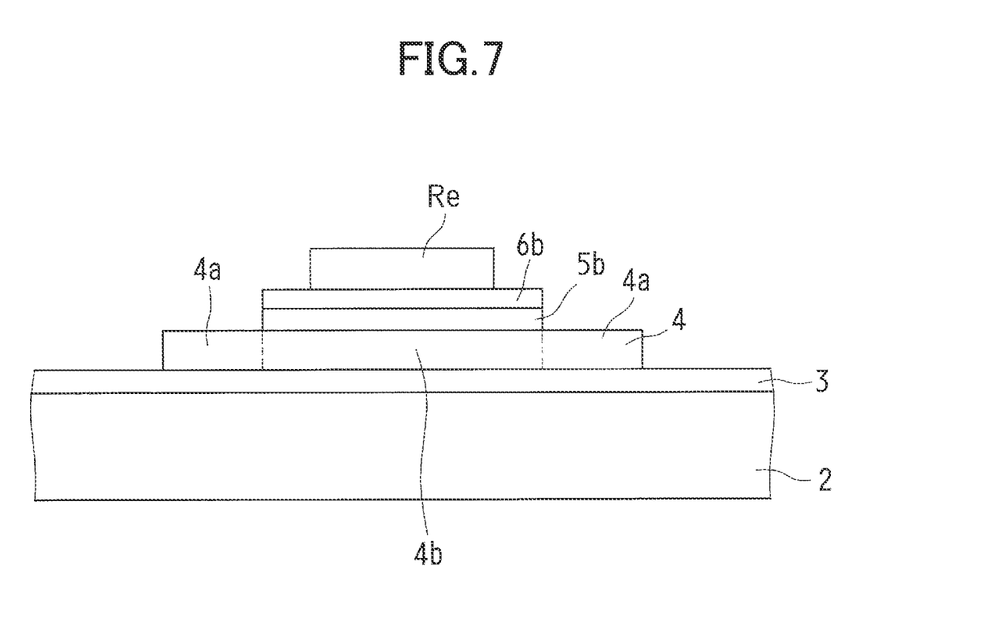
FIG. 7 is a cross-sectional view schematically illustrating the transistor in a second photolithography step.

FIG. 7 is a cross-sectional view schematically illustrating the transistor in a second photolithography step.

In the second photolithography step, a resist mask Re is patterned by photolithography on the first resist pattern gate electrode 6b of FIG. 6. The resist mask Re here is provided to overlap the first resistance region 4b illustrated in FIG. 1, and is formed as a second resist pattern covering only a part of the first resist pattern gate electrode 6b.

As illustrated in FIG. 7, the resist mask Re shaped in accordance with the second resist pattern is smaller in area than the first resist pattern, such that the first resist pattern gate electrode 6b shaped in accordance with the first resist pattern is partially exposed.

Figure 8:
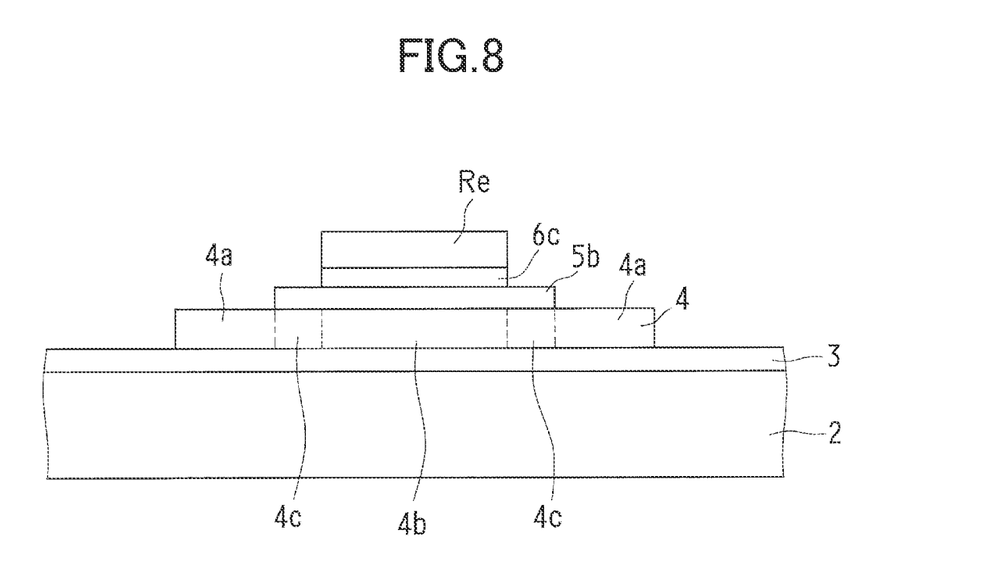
FIG. 8 is a cross-sectional view schematically illustrating the transistor in a second gate etching step.

FIG. 8 is a cross-sectional view schematically illustrating the transistor in a second gate etching step.

In FIG. 8, the first resist pattern gate electrode 6b of FIG. 7 is etched (by, for example, dry etching). As a result, the first resist pattern gate electrode 6b is removed except a portion covered with the resist mask Re, and the portion is shaped in accordance with the second resist pattern (i.e. the second resist pattern gate electrode 6c). Here, the first resist pattern gate insulating layer 5b is not etched, maintaining a shape in accordance with the first resist pattern. As a result, in the oxide semiconductor layer 4, the first resistance region 4b directly below the second resist pattern gate electrode 6c becomes narrow, and the second resistance regions 4c not covered with the second resist pattern gate electrode 6c are provided between the first resistance region 4b and the conductive regions 4a. Note that, in the second gate etching step, the plasma of the dry etching may be injected through the first resist pattern gate insulating layer 5b into the oxide semiconductor layer 4, so that the resistance of the oxide semiconductor layer 4 (in particular, the second resistance regions 4c) may be reduced.

Figure 9:
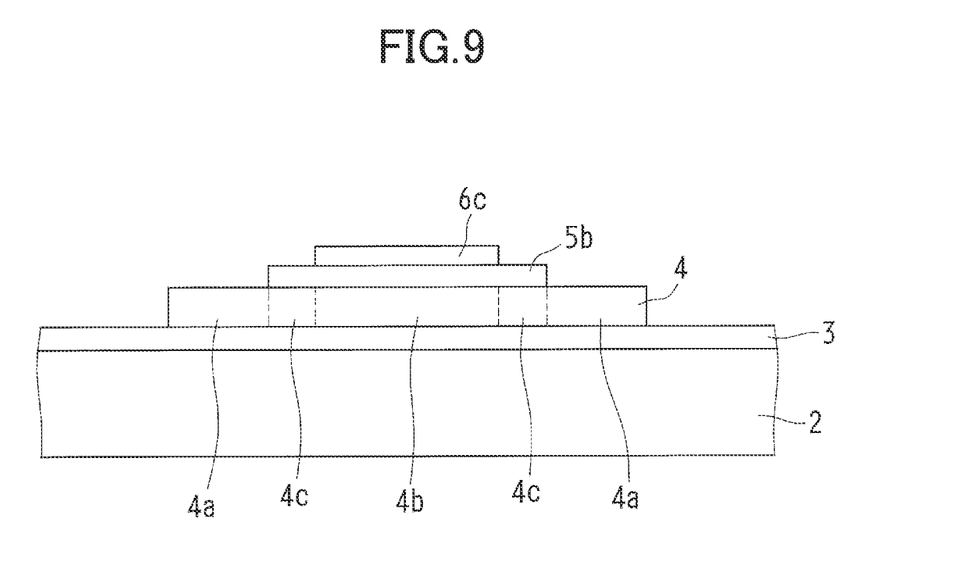
FIG. 9 is a cross-sectional view schematically illustrating the transistor before forming a protective layer.
Figure 10:
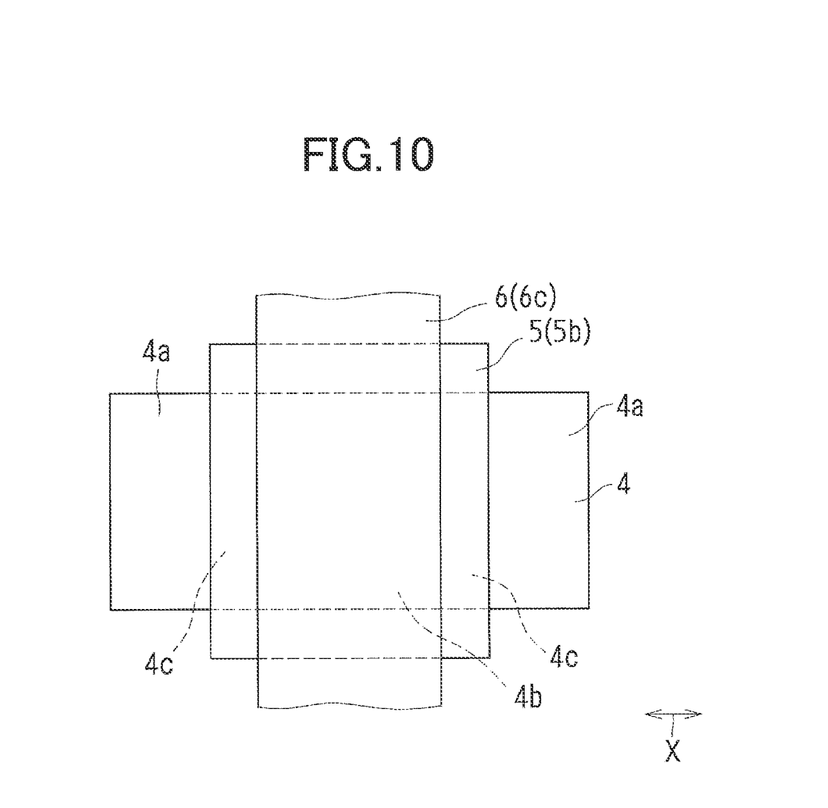
FIG. 10 is a plan view schematically illustrating the transistor in FIG. 9.

FIG. 9 is a cross-sectional view schematically illustrating the transistor before forming a protective layer. FIG. 10 is a plan view schematically illustrating the transistor in FIG. 9.

Prior to forming the protective layer 7 illustrated in FIG. 1, a second removal step is carried out. The resist mask Re is removed when the etching to form the second resist pattern gate electrode 6c is completed. Moreover, if the conductivity providing step is not carried out after the first etching step, the transistor illustrated in FIG. 9 may be treated with plasma. In such a case, the plasma is injected through the gate insulating layer 5 into the oxide semiconductor layer 4, so that the resistance of the oxide semiconductor layer 4 (in particular, the second resistance regions 4c) is reduced. That is, the resistance of the second resistance regions 4c can be reduced while the conductivity is provided to the conductive region 4a. Note that in injecting the plasma into the oxide semiconductor layer 4, a degree of the resistance variation differs with or without the gate insulating layer 5. The conductive regions 4a become conductive; whereas, the second conductive regions 4c do not become conductive.

As can be seen, when treated with the plasma, the oxide semiconductor layer 4 is covered in different manners for each region, such that the first resistance region is larger in resistance than the second resistance regions.

As illustrated in FIG. 10, in planner view, the gate electrode 6 extends out of the oxide semiconductor layer 4, and, for example, acts as a gate wire connecting to an other transistor. The gate electrode 6 in FIG. 10 extends linearly. However, the gate electrode 6 may extend in any given manner. For example, the gate electrode 6 may appropriately change in extending direction, depending on a position of a connecting target. Moreover, the gate insulating layer 5 in FIG. 10 stretches slightly out of the oxide semiconductor layer 4 to be distinguishable from the gate electrode 6. However, the gate insulating layer 5 may stretch in any given manner. For example, the gate insulating layer 5 may extend as the gate electrode 6 does to connect to, for example, an other transistor. A shape of wiring including the gate electrode 6 will be described in detail, with reference to FIGS. 17A and 17B to be shown later.

Compared with FIG. 9, FIG. 1 above shows the oxide semiconductor layer 4, the gate insulating layer 5, and the gate electrode 6 covered with the protective layer 7. The protective layer 7 is formed of the same material with the same technique as the underlayer 3 is, and has a thickness of, for example, 100 nm or more and 500 nm or less. In this embodiment, as a second insulating film 7, an $SiN_x$ film having a thickness of 100 nm and an $SiO_2$ film having a thickness of 300 nm are sequentially formed by the CVD.

After the protective layer 7 is formed, the protective layer 7 undergoes a heat treatment (an annealing treatment). The annealing treatment is given at, for example, 200° C. to 400° C. Here, together with the protective layer 7, the oxide semiconductor layer 4 also undergoes the annealing treatment.

In the protective layer 7, contact holes are formed by a known photolithography technique to partially expose the oxide semiconductor layer 4. As illustrated in FIG. 1, the source contact hole 7a corresponding to the source electrode 8 is positioned to overlap one of the conductive regions 4a, and the drain contact hole 7b corresponding to the drain electrode 9 is positioned to overlap an other one of the conductive regions 4a.

After the protective layer 7 is formed, an electrode conductive film is formed on the protective layer 7 and in the contact holes. The electrode conductive film is a base material of the source electrode 8 and the drain electrode 9. Materials of the electrode conductive film may be, for example, those of the gate electrode 6. In this embodiment, the electrode conductive film is a multilayer film including: a lower layer formed of a Ti film having a thickness of 30 nm; a main layer formed of an Al film having a thickness of 300 nm; and an upper layer formed of a Ti film having a thickness of 50 nm.

The electrode conductive film is patterned, and the first transistor 1a illustrated in FIG. 1 is formed. That is, the electrode conductive film is patterned to be the source electrode 8 and the drain electrode 9 spaced apart from each other.

In planar view, the source electrode 8 and the drain electrode 9 extend out of the oxide semiconductor layer 4, and may be, for example, wiring connecting to an other transistor.

Although not shown, a planarization film may be provided to cover a top face (on which the source electrode 8 and the drain electrode 9 are formed) of the transistor. On the planarization film, such components as a pixel electrode may be provided. Furthermore, above the transistor, display elements such as an organic light-emitting diode (OLED), a quantum light-emitting diode (QLED), and a liquid crystal display (LCD) to be described later may be provided.

In the above method for manufacturing a display device, the oxide semiconductor layer 4 (the second resistance regions 4c) not including conductive regions 4a is provided between the oxide semiconductor layer 4 (the first resistance region 4b) directly below the gate electrode and the oxide semiconductor layer 4 acting as the conductive regions 4a. Such a feature the transistor to have variation in characteristic. Specifically, thanks to the second resistance regions 4c, the first transistor 1a increases in S value (threshold factor), and a variation in current value with respect to gate voltage becomes gradual. Such a feature makes it possible to readily control brightness varying in accordance with the current value.

The oxide semiconductor layer 4 may be made not only of the above materials but also of other materials. An oxide semiconductor contained in the oxide semiconductor layer 4 may be, for example, an amorphous oxide semiconductor (a non-crystalline oxide semiconductor) and a crystalline oxide semiconductor having a crystalline portion. Examples of the crystalline oxide semiconductor include a polycrystalline oxide semiconductor, a microcrystalline oxide semiconductor, and a crystalline oxide semiconductor whose c-axis is substantially orthogonal to a plane of a layer.

Moreover, the oxide semiconductor layer 4 may be a multilayer including two or more layers. In such a case, the oxide semiconductor layer 4 may contain a non-crystalline oxide semiconductor and a crystalline oxide semiconductor. Alternatively, the oxide semiconductor layer 4 may include a plurality of oxide semiconductor layers each having a different crystalline structure, and a plurality of non-crystalline oxide semiconductors.

Described next in detail are materials and structures of the non-crystalline oxide semiconductor and the crystalline oxide semiconductor. The oxide semiconductor layer 4 may contain at least one of metal elements from among, for example, In, Ga, and Zn. The semiconductor used in this embodiment is an In—Ga—Zn—O-based semiconductor (e.g. Indium Gallium Zinc Oxide). Here, the In—Ga—Zn—O-based semiconductor is a ternary oxide containing indium (In), gallium (Ga), and zinc (Zn). Proportions (a composition ratio) of In, Ga, and In include (is), but not limited to, In:Ga:Zn=2:2:1, In:Ga:Zn=1:1:1, and In:Ga:Zn=1:1:2. Moreover, the In—Ga—Zn—O-based semiconductor may be amorphous or crystalline. The crystalline In—Ga—Zn—O-based semiconductor preferably has a c-axis substantially orthogonal to a plane of a layer.

A TFT including an In—Ga—Zn—O-based semiconductor layer is higher in electron mobility and lower in leak current than an a—Si TFT, and thus can be preferably used as a transistor of the display device 1.

The oxide semiconductor layer 4 may include, instead of the In—Ga—Zn—O-based semiconductor, an other oxide semiconductor such as, for example, an In—Sn—Zn—O-based semiconductor. The In—Sn—Zn—O-based semiconductor is a ternary oxide containing In, tin (Sn), and Zn. An example of the In—Sn—Zn—O-based semiconductor includes $In:O_3$—$SnO_2$—ZnO (InSnZnO).

The oxide semiconductor layer 4 may include not only the In—Sn—Zn—O-based semiconductor but also such materials as an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—G—O-based semiconductor, a Cd—Pb—O-based semiconductor, cadmium oxide (CdO), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, an Al—Ga—Zn—O-based semiconductor, a Ga—Zn—O-based semiconductor, an In—Ga—Zn—Sn—O-based semiconductor, InGaO$_3$(ZnO)$_5$, magnesium oxide zinc (Mg$_x$Zn$_{1-x}$O), and cadmium zinc oxide (CdxZm$_{1-x}$O). The Zn—O-based semiconductor may be a non-crystalline (amorphous) ZnO semiconductor, a polycrystalline ZnO semiconductor, or a microcrystalline ZnO) semiconductor including a mix of a non-crystalline semiconductor and a polycrystalline semiconductor, each of which may either additionally include one or more impurity elements from among elements of group 1, group 13, group 14, group 15, and group 17, or include no such impurity elements.

In this embodiment, a mask pattern used in the second photolithography step is different from a mask pattern used in the first photolithography step. The first resist pattern is formed wider in the channel length direction X than the second resist pattern. As can be seen, the photolithography steps are carried out, using different mask patterns to form patterns in different shapes. Such a feature makes it possible to readily adjust a width of the gate electrode 6.

Described next is a modification of a photolithography step using a different technique, with reference to FIGS. 11A and 11B.

Figure 11A:
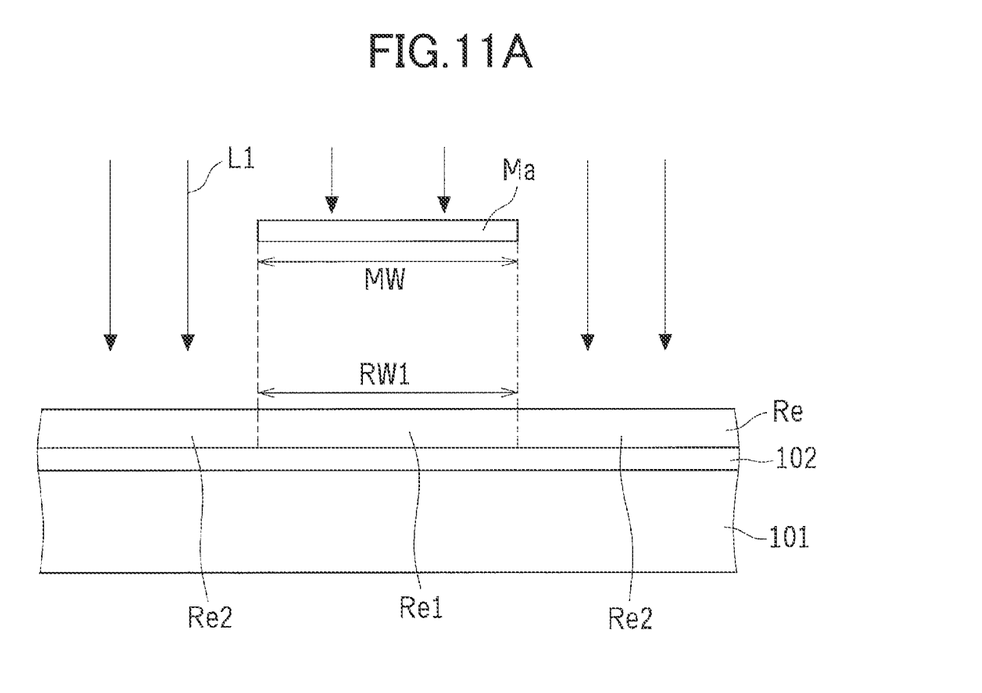
FIG. 11A is a drawing illustrating a photolithography step to be performed with a standard exposure doze.

FIG. 11A is a drawing illustrating a photolithography step to be performed with a standard exposure doze. FIG. 11B is a drawing illustrating a photolithography step to be performed with a large exposure doze.

Figure 11B:
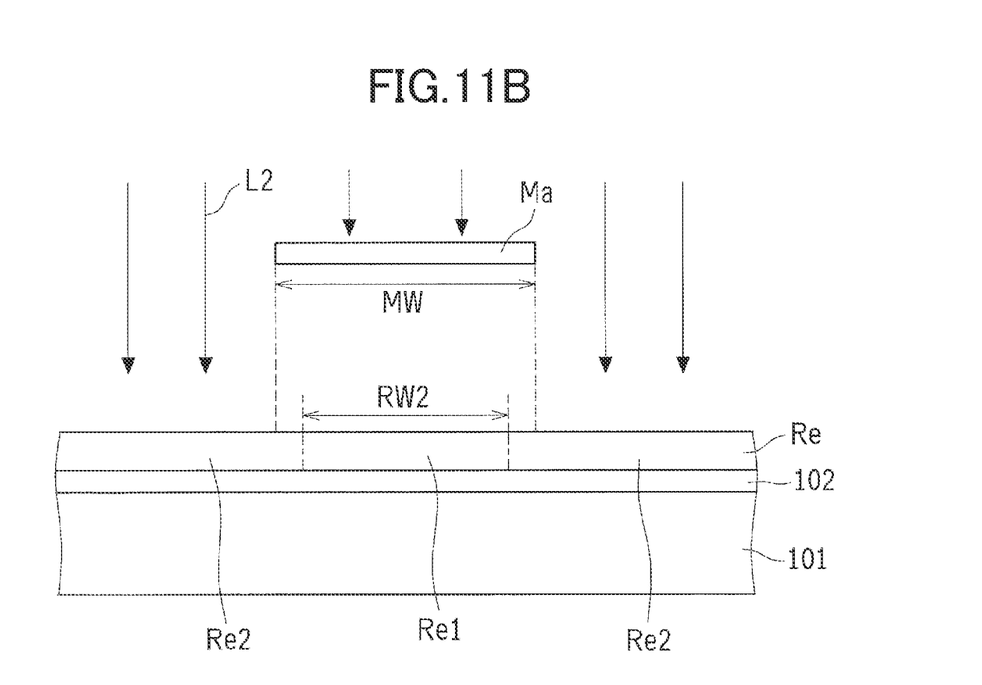
FIG. 11B is a drawing illustrating a photolithography step to be performed with a large exposure doze.

FIGS. 11A and 11B show an example of the photolithography steps. On a prototype substrate 101, a prototype film 102 and a resist mask Re are stacked. After that, light (a first light ray L1 or a second light ray L2) is emitted through a light-shielding mask Ma blocking a portion of the resist mask Re from the light. Hence, the resist mask Re is provided with an unexposed region Re1 not exposed with the light, and an exposed region Re2 exposed with the light.

Usually, in the photolithography step, a standard exposure doze is set for the emitted light (the first emitted light ray L1) so that a width (a first light-exposure width RW1 in FIG. 11A) of light exposure on the resist mask Re substantially matches a width (a mask width MW) in which the light-shielding mask Ma blocks the light.

Here, when the exposure doze of the light is changed, a light-exposure area near the light-shielding mask Ma varies. As illustrated in FIG. 11B, if the second light ray L2 having a large exposure doze is emitted, a second light-exposure width RW2, in which the resist mask Re is exposed with light, becomes narrower than the mask width MW. Hence, even if the same mask pattern is used, a change in the exposure doze in a photolithography step can vary the light-exposure area. Accordingly, the shape of the resist mask Re can be changed.

In the modification using the above technique, a mask pattern used in the second photolithography step is the same as a mask pattern used in the first photolithography step, and an exposure doze set for the second photolithography step is different from an exposure doze set for the first photolithography step. Thus, the use of a common mask pattern makes it possible to simplify the design of the resist mask and form the pattern of the resist mask into different shapes.

Second Embodiment

Described next is a display device according to a second embodiment of the present disclosure, with reference to the drawings. Note that identical reference signs are used to denote identical or substantially identical components in functions between the second and first embodiments. Such components will not be elaborated upon here.

Figure 12:
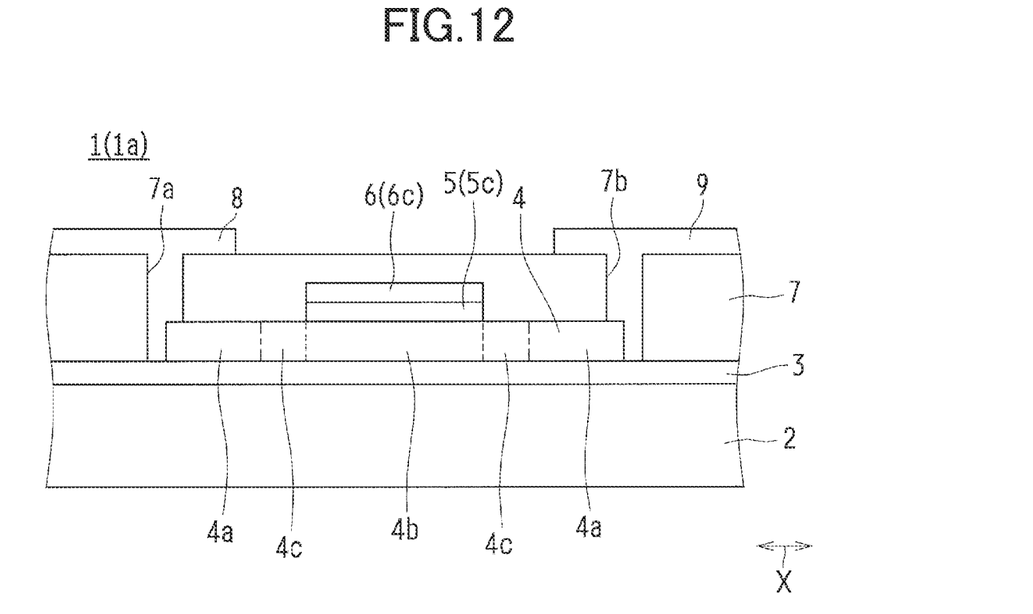
FIG. 12 is a cross-sectional view schematically illustrating a display device according to a second embodiment of the present disclosure.

A difference between the second embodiment and the first embodiment is an area in which the gate insulating layer 5 is provided. Specifically, the gate insulating layer 5 (a second resist pattern gate insulating layer 5c) overlaps the first resistance region 4b of the oxide semiconductor layer 4, and matches the gate electrode 6 (the second resist pattern gate electrode 6c).

Described next is a step for manufacturing a transistor according to the second embodiment, with reference to the drawings.

Figure 13:
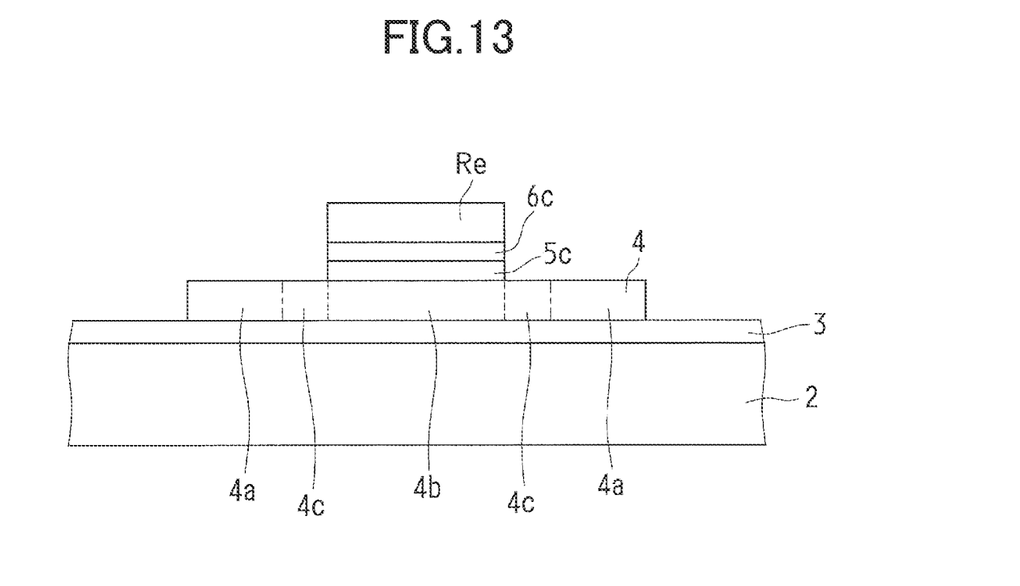
FIG. 13 is a cross-sectional view schematically illustrating a transistor in a self-alignment step of the second embodiment.
Figure 14:
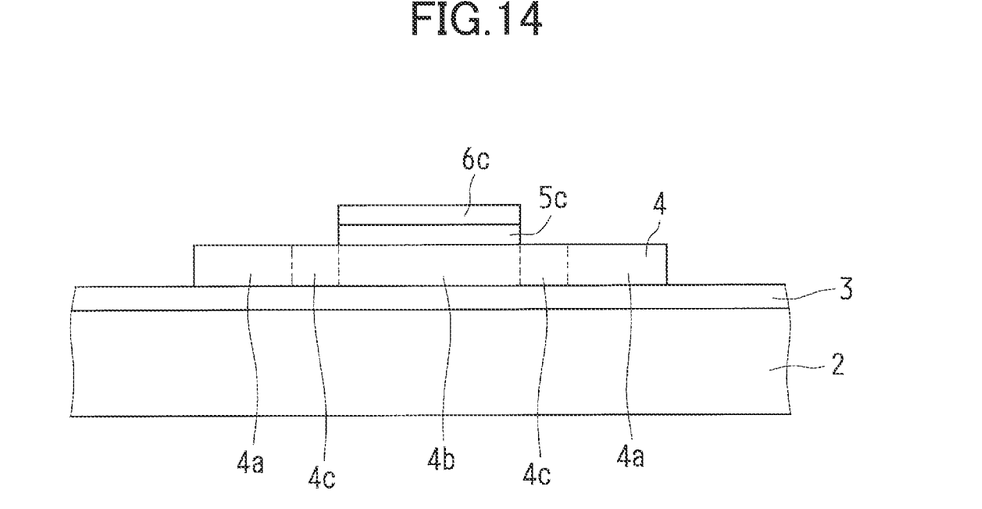
FIG. 14 is a cross-sectional view schematically illustrating the transistor before forming the protective layer in the second embodiment.

FIG. 13 is a cross-sectional view schematically illustrating the transistor in a self-alignment step of the second embodiment. FIG. 14 is a cross-sectional view schematically illustrating the transistor before forming a protective layer in the second embodiment.

The second embodiment proceeds with substantially the same sequence as the first embodiment does until the second gate etching step. In FIG. 13, the gate insulating layer 5 of FIG. 8 is etched (by, for example, dry etching). That is, in the self-alignment step, the gate insulating layer 5 is continuously etched using the same resist mask Re, as seen in the first gate etching step and the insulating layer etching. As a result, the first resist pattern gate electrode Sb illustrated in FIG. 8 is patterned to match the second resist pattern gate electrode 6c in shape, and is shaped in accordance with the second resist pattern (the second resist pattern gate insulating layer 5c). Hence, the introduction of the self-alignment step makes it possible to simplify steps.

After that, as illustrated in FIG. 14, the resist mask Re is removed, followed by formation of protective layer 7, the source electrode 8, and the drain electrode 9. Note that, after the resist mask Re is removed, the plasma treatment may be applied so that the second resistance regions 4c may be adjusted not to be conductive.

FIG. 12 is a cross-sectional view schematically illustrating the display device according to the second embodiment of the present disclosure. In view of visibility, FIG. 12 is not hatched.

Third Embodiment

Described next is a display device according to a third embodiment of the present disclosure, with reference to the drawings. Note that identical reference signs are used to denote identical or substantially identical components in functions between this embodiment and the first and second embodiments. Such components will not be elaborated upon here.

Figure 15:
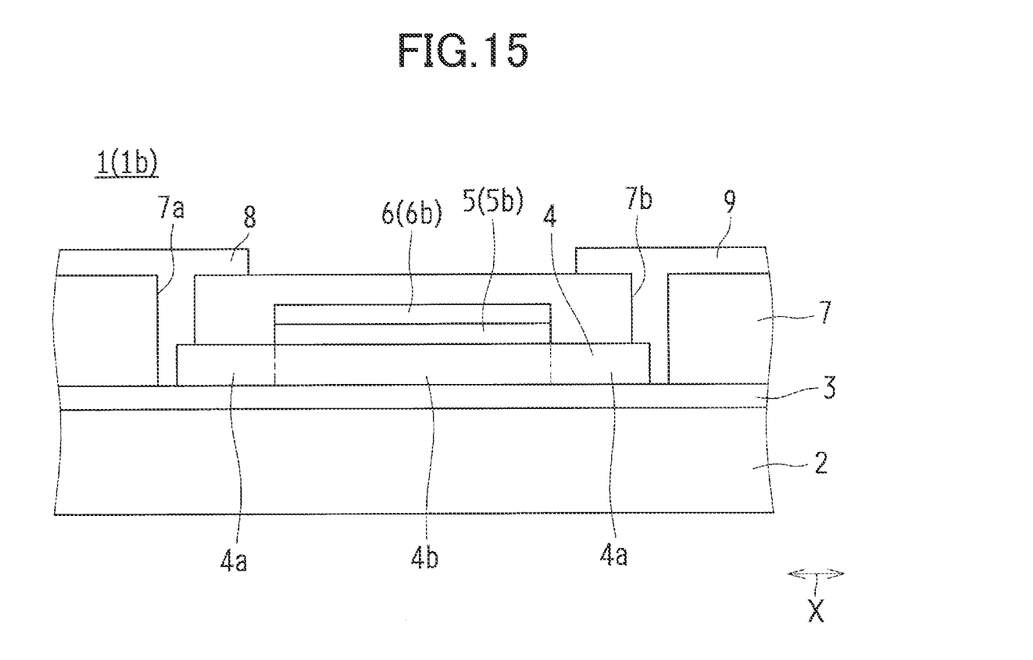
FIG. 15 is a cross-sectional view schematically illustrating a display device according to a third embodiment of the present disclosure.

FIG. 15 is a cross-sectional view schematically illustrating a display device according to a third embodiment of the present disclosure. In view of visibility, FIG. 15 is not hatched.

In the third embodiment, the display device 1 includes the second transistor 1b as well as the first transistor 1a. FIG. 15 shows an enlarged view of one second transistor 1b among a plurality of transistors formed on the substrate 2. Further formed on the same substrate 2 are at least one or more first transistors 1a.

The second transistor 1b is substantially the same in structure as the first transistor 1a illustrated in FIG. 1. A difference between the second transistor 1b and the first transistor 1a is an area in which the gate electrode 6 overlaps the oxide semiconductor layer 4. Specifically, the oxide semiconductor layer 4 includes: the conductive regions 4a provided with conductivity; and the first resistance region 4b directly below the gate electrode 6, and omits the second resistance regions 4c. The gate electrode 6 (the first resist pattern gate electrode 6b) and the gate insulating layer 5 (the first resist pattern gate insulating layer 5b) overlap the first resistance region 4b, and match in shape.

Described next is a step for manufacturing a second transistor according to the third embodiment, with reference to the drawings.

Figure 16:
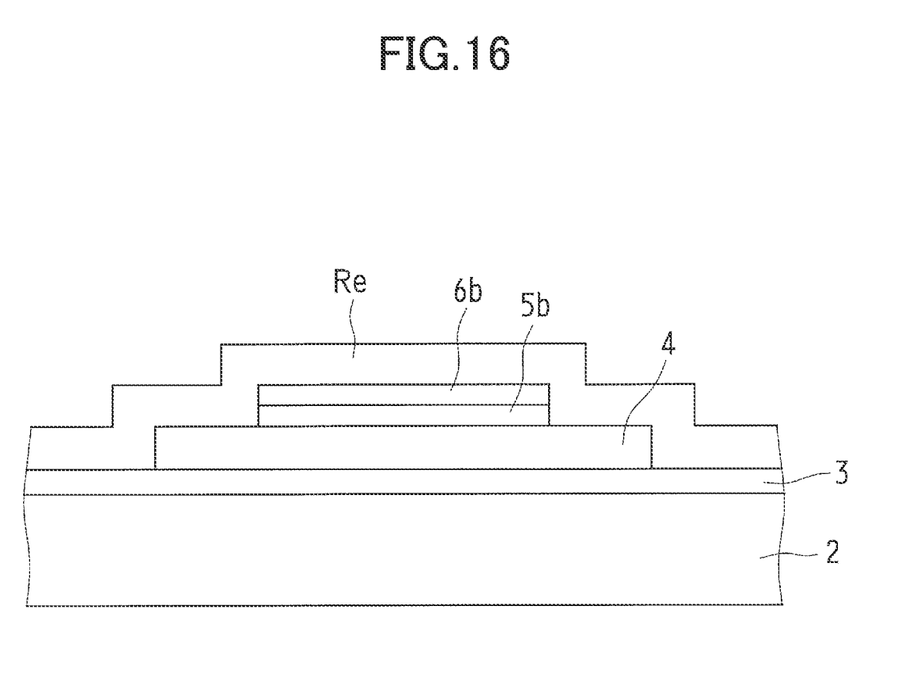
FIG. 16 is a cross-sectional view schematically illustrating a second transistor whose surface is entirely covered with a resist mask.

FIG. 16 is a cross-sectional view schematically illustrating the second transistor whose surface is entirely covered with a resist mask.

The second transistor 1b is manufactured in substantially the same sequence as the first transistor 1a is manufactured until the insulating layer etching step. As to the first transistor 1a, the gate electrode conductive film 6a and the gate insulating film Sa are shaped in accordance with the first resist pattern, and the gate electrode 6 is etched for the second time. The second transistor 1b, however, does not receive the second etching. In the second etching on the gate electrode 6 (the first resist pattern gate electrode 6b) of the first transistor 1a, the entire surface of the second transistor 1b is covered with a resist mask Re as illustrated in FIG. 16. This is how the gate electrode 6 (the first resist pattern gate electrode 6b) is protected not to be etched.

When the second etching is completed, the protective layer 7, the source electrode 8, and the drain electrode 9 may be formed on the second transistor 1b as well as on the first transistor 1a. Moreover, the conductivity may be provided to the second transistor 1b together with the first transistor 1a.

As can be seen, in the third embodiment, the second photolithography step involves forming: a first transistor region in which a resist covers a portion of the gate electrode 6; and a second transistor region in which the resist covers all of the gate electrode 6. The second gate etching step involves etching the gate electrode 6 in the first transistor region to form the first transistor 1a, and protecting, with the resist, the gate electrode 6 in the second transistor region to form the second transistor 1b. As can be seen, a common step is applied to the first transistor 1a and the second transistor 1b while the step is partially modified. Such a feature makes it possible to form two transistors with different characteristics on the same substrate 2.

Figure 17A:
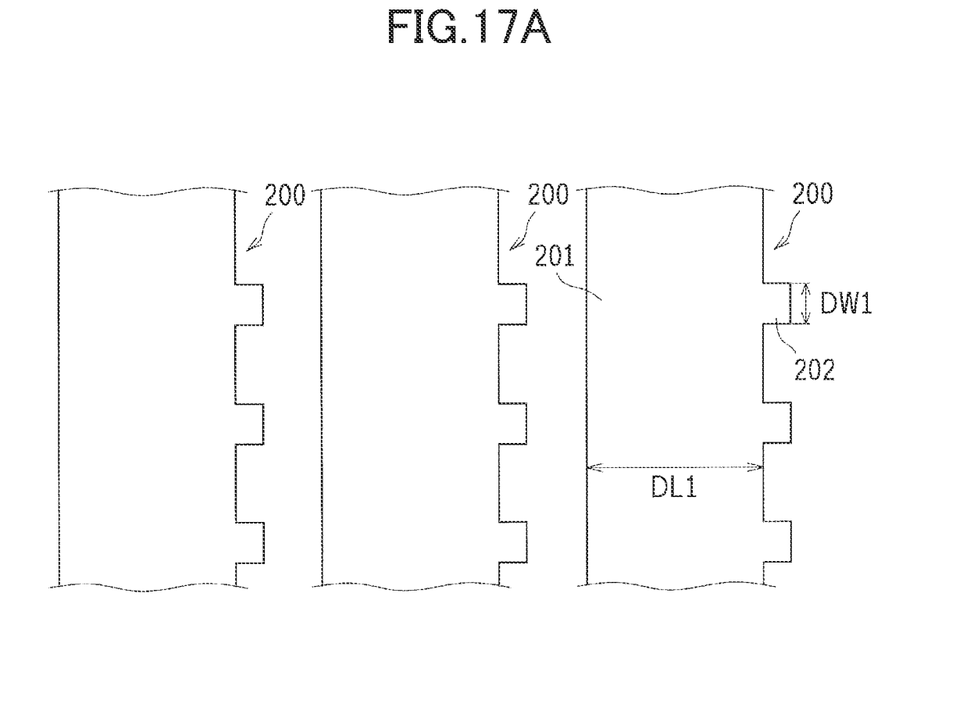
FIG. 17A is a schematic top view of wiring corresponding to a first resist pattern.
Figure 17B:
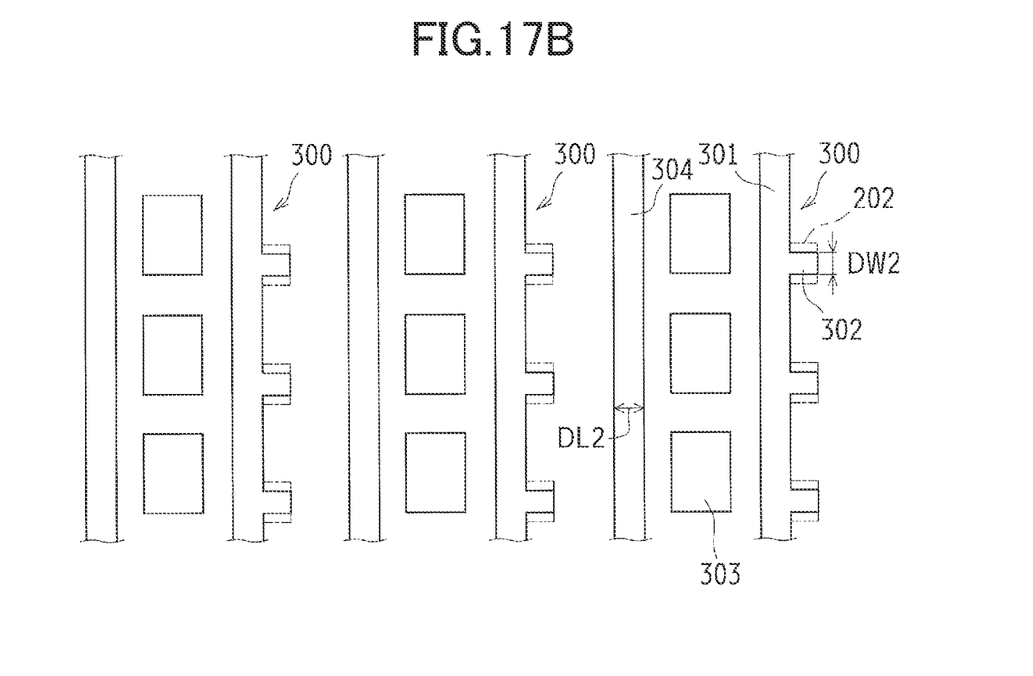
FIG. 17B is a schematic top view of wiring corresponding to a second resist pattern.

Described next is a shape of wiring including the gate electrode 6, with reference to the drawings.

FIG. 17A is a schematic top view of wiring corresponding to the first resist pattern.

In the display device 1, a plurality of wires are formed to correspond to a pixel circuit. The wires include a gate control line 301 and a light-emission control line 304 illustrated in FIG. 17B. In this embodiment, the wires are formed of the same material, and in the same layer, as the gate electrode 6 is formed. Specifically, the wires are a part of the gate electrode conductive film 6a, and are simultaneously formed when the gate electrode 6 is formed.

FIG. 17A is a top view, extracting only wires including the gate electrode 6 shaped in accordance with the first resist pattern. FIG. 17A shows an area across a plurality of transistors on the substrate 2. In this embodiment, the wires and the gate electrode 6 together form a first wiring pattern 200. The first wiring pattern 200 includes: a strip wire 201 formed widely and extending linearly; and a first electrode corresponding portion 202 provided to protrude from the strip wire 201 toward outside. FIG. 17A partially shows an enlarged view of three first wiring patterns 200 horizontally arranged in the drawing. However, the number of the first wiring patterns 200 shall be limited to three. The number of the first wiring patterns 200 to be provided to the substrate 2 may be adjusted appropriately.

The strip wire 201 vertically extends in FIG. 17A. The first electrode corresponding portion 202, provided to protrude from a side edge (a right side in FIG. 17A) of the strip wire 201, includes a plurality of first electrode corresponding portions 202 vertically spaced apart from each other in FIG. 17A. A first electrode corresponding portion 202 corresponds to the gate electrode 6 of one of the first transistor 1a and the second transistor 1b. The number and the positions of the first electrode corresponding portions 202 may be adjusted appropriately, depending on the transistors to be provided on the electrode 2. A direction in which the strip wire 201 extends corresponds to the above channel length direction X. That is, a vertical width (a first width DW1) of the first electrode corresponding portion 202 in FIG. 17A corresponds to a width of the first resist pattern gate electrode 6b in the channel length direction X. Note that, for a comparison with the second resist pattern to be described later, a horizontal width of the strip wire 201 in FIG. 17A is referred to as a first wire width DL1.

FIG. 17B is a schematic top view of wiring corresponding to the second resist pattern.

FIG. 17B is a top view, extracting only wires including the gate electrode 6 shaped in accordance with the second resist pattern. FIG. 17B shows the same area as FIG. 17A shows. The first wiring pattern 200 illustrated in FIG. 17A is, for example, etched to be shaped into a second wiring pattern 300 illustrated in FIG. 17B. The second wiring pattern 300 includes: the gate control line 301; a second electrode corresponding portion 302; a capacitance electrode 303; and the light-emission control line 304.

The gate control line 301, vertically extending in FIG. 17B, is linear and formed narrower than the strip wire 201. The gate control line 301 corresponds to a side edge (a right side in FIG. 17B), of the strip wire 201, provided with the second electrode corresponding portion 202.

The second electrode corresponding portion 302, provided to protrude from a side edge (a right side in FIG. 17B) of the gate control wire 301, includes a plurality of second electrode corresponding portions 302 vertically spaced apart from each other in FIG. 17B. The second electrode corresponding portion 302 is provided to overlap the first electrode corresponding portion 202. A vertical width (a second width DW2) of the second electrode corresponding portion 302 in FIG. 17B is narrower than the first width DW1. That is, the second width DW2 corresponds to a width of the second resist pattern gate 6c in the channel length direction X. Note that a dot-and-dash line illustrated in FIG. 17B represents the first electrode corresponding portion 202 when the first wiring pattern 200 and the second wiring pattern 300 overlap.

The light-emission control line 304, vertically extending in FIG. 17B, is linear and formed narrower than the strip wire 201. The light-emission control line 304 corresponds to a side edge (a left side in FIG. 17B), of the strip wire 201, across from the first electrode corresponding portion 202. A horizontal width (a second wire width DL2) of the light-emission control line 304 in FIG. 17B is narrower than the first wire width DL1.

The capacitance electrode 303 is shaped into a rectangle, and positioned between the gate control line 301 and the light-emission control line 304. The capacitance electrode 303 includes a plurality of capacitance electrodes 303 vertically spaced apart from each other in FIG. 17B.

The first gate etching step involves forming, with the first resist pattern, the strip wire 201 corresponding to the gate control line 301, the light-emission control line 304, and the capacitance electrode 303 of the second resist pattern connected together. The second gate etching step involves etching, with the second resist pattern, the strip wire 201 between the gate control line 301, the light-emission control line 304, and the capacitance electrode 303 so that the lines and the electrode are separated from one an other.

That is, a wire shaped in the first gate etching step is wider (e.g. the first wire width DL1) than wires formed in the second gate etching (e.g. the second wire width DL2). Note that the width of the light-emission control line 304 is shown as a width of a wire formed with the second resist pattern. The width of the gate control line 301 may also be formed narrower than the first wire width DL1.

As can be seen, the gate control line 301 and the light-emission control line 304 extending long are provided across opposing ends of a display region in the display device 1.

FIG. 17B shows only the second electrode corresponding portion 302 narrower than the first electrode corresponding portion 202. However, the width of the second electrode corresponding portion 302 is any given width, and the second electrode corresponding portion 302 as wide as the first electrode corresponding portion 202 may be included in the second wiring pattern 300.

The display device 1 according to the embodiments may be any given one as long as the display device 1 is a display panel including a display element. The display element includes two kinds of display elements: one of which has brightness and transmittance controlled by current, and an other one of which by voltage. Display elements to be controlled by current are used for such displays as an organic EL display including OLEDs, an EL display such as an inorganic EL display including inorganic light-emitting diodes, and a QLED display including QLEDs. Moreover, display elements controlled by voltage include liquid crystal display elements.

The embodiments disclosed herewith are examples in all respects, and shall not be interpreted to be limitative. The scope of the present disclosure shall be interpreted not by the above embodiments alone, but by the recitations of the claims. Furthermore, all the modifications equivalent to the features of, and within the scope of, the claims are to be included within the scope of the present disclosure.

REFERENCE SIGNS LIST

1 Display Device
1a First Transistor
1b Second Transistor
2 Substrate
3 Underlayer
4 Oxide Semiconductor Layer
4a Conductive Region
4b First Resistance Region
4c Second Resistance Region
5 Gate Insulating Layer
5a Gate Insulating Film
5b First Resist Pattern Gate Insulating Layer
5c Second Resist Pattern Gate Insulating Layer
6 Gate Electrode
6a Gate Electrode Conductive Film
6b First Resist Pattern Gate Electrode
6c Second Resist Pattern Gate Electrode
7 Protective Layer
7a Source Contact Hole
7b Drain Contact Hole
8 Source Electrode
9 Drain Electrode
200 First Wiring Pattern
201 Strip Wire
202 First Electrode Corresponding Portion
300 Second Wiring Pattern
301 Gate Control Line
302 Second Electrode Corresponding Portion
303 Capacitance Electrode
304 Light-Emission Control Line
Re Resist Mask
X Channel Length Direction

The invention claimed is:

1. A display device comprising:
a substrate;
a first transistor formed on the substrate; and
a second transistor formed on the substrate,
the first transistor including:
  a first oxide semiconductor layer formed on the substrate;
  a first gate insulating layer formed on the first oxide semiconductor layer; and
  a first gate electrode formed on the first gate insulating layer,
the first oxide semiconductor layer including:
  a first conductive region provided with conductivity;
  a first central resistance region positioned below the first gate electrode; and
  a first lateral resistance region provided between the first conductive region and the first central resistance region, and positioned outside the first gate electrode, and
the first central resistance region being larger in resistance than the first lateral resistance region, and the first gate insulating layer of the first transistor covering only the first central resistance region and the first lateral resistance region of the first oxide semiconductor layer, wherein
the second transistor includes:
  a second oxide semiconductor layer formed on the substrate;
  a second gate insulating layer formed on the second oxide semiconductor layer; and
  a second gate electrode formed on the second gate insulating layer,
the second oxide semiconductor layer includes:
  a second conductive region provided with conductivity; and
  a second central resistance region positioned below the second gate electrode,
the second gate insulating layer matches the second central resistance region and the second gate electrode in shape, and
the second central resistance region is provided in contact with the second conductive region.

2. The display device according to claim 1, wherein the first gate insulating layer is longer in a channel length direction than the first gate electrode.

3. The display device according to claim 1, wherein the first gate insulating layer matches the first central resistance region and the first gate electrode in shape.

* * * * *